United States Patent
Koontz et al.

(10) Patent No.: US 9,553,038 B2
(45) Date of Patent: Jan. 24, 2017

(54) SEMICONDUCTOR COOLING APPARATUS

(75) Inventors: Christopher R. Koontz, Manhattan Beach, CA (US); Charles Chu, Temple City, CA (US); Rosalio S. Vidaurri, Los Angeles, CA (US)

(73) Assignee: Raytheon Company, Waltham, MA (US)

(*) Notice: Subject to any disclaimer, the term of this patent is extended or adjusted under 35 U.S.C. 154(b) by 969 days.

(21) Appl. No.: 13/558,759

(22) Filed: Jul. 26, 2012

(65) Prior Publication Data
US 2013/0255917 A1    Oct. 3, 2013

Related U.S. Application Data

(60) Provisional application No. 61/619,153, filed on Apr. 2, 2012.

(51) Int. Cl.
| | |
|---|---|
| *F28F 7/00* | (2006.01) |
| *H01L 23/433* | (2006.01) |
| *H01L 23/473* | (2006.01) |

(52) U.S. Cl.
CPC ......... *H01L 23/4332* (2013.01); *H01L 23/473* (2013.01); *H01L 2924/0002* (2013.01); *H01L 2924/15311* (2013.01)

(58) Field of Classification Search
CPC ............... F28D 2021/0028; F28D 2021/0029; F28D 15/00; H01L 23/4332; H01L 23/34; H01L 23/36; H01L 23/367; H01L 23/3672; H01L 23/373; H01L 23/473; H01L 23/467; H01L 23/40; H01L 23/4006; H01L 23/46; H05K 7/20218; H05K 7/20336; H05K 7/20254; H05K 7/20263; H05K 7/20454; F28F 3/02; F28F 13/00

USPC ........... 165/80.4, 46, 81, 83, 139, 144, 185; 361/698–702

See application file for complete search history.

(56) References Cited

U.S. PATENT DOCUMENTS

| | | | |
|---|---|---|---|
| 4,602,314 A | * | 7/1986 | Broadbent .................. 361/719 |
| 4,644,385 A | | 2/1987 | Nakanishi et al. |
| 4,747,450 A | | 5/1988 | Ikegame et al. |
| 4,759,403 A | * | 7/1988 | Flint et al. .................. 165/80.4 |

(Continued)

FOREIGN PATENT DOCUMENTS

| | | |
|---|---|---|
| EP | 1739746 A2 | 1/2007 |
| EP | 2437293 A2 | 4/2012 |

(Continued)

*Primary Examiner* — Judy Swann
*Assistant Examiner* — Jose O Class-Quinones
(74) *Attorney, Agent, or Firm* — Burns & Levinson LLP; Joseph M. Maraia

(57) ABSTRACT

An apparatus for cooling semiconductor elements uses heat exchangers to transfer heat from the semiconductor elements to a coolant flowing through the heat exchangers. A central body, made from a flexible material, is positioned between the heat exchangers and a manifold from which the coolant is provided. The central body includes a plurality of flexible runners fluidly coupled to each heat exchanger and the manifold to provide the coolant to the heat exchanger. Heat is transferred away from the semiconductor elements by the coolant and heated coolant is returned from the heat exchanger to the manifold. Each flexible runner is configured to flex to conform to a height of a respective semiconductor element and thereby apply a force to the heat exchanger to maintain contact with the semiconductor element.

24 Claims, 11 Drawing Sheets

(56) References Cited

U.S. PATENT DOCUMENTS

| | | | |
|---|---|---|---|
| 4,977,444 A | 12/1990 | Nakajima et al. | |
| 5,125,451 A | 6/1992 | Matthews | |
| 5,150,274 A | 9/1992 | Okada et al. | |
| 5,166,863 A | 11/1992 | Shmunis | |
| 5,329,419 A | 7/1994 | Umezawa | |
| 5,388,635 A * | 2/1995 | Gruber et al. | 165/80.4 |
| 6,111,749 A | 8/2000 | Lamb et al. | |
| 6,212,074 B1 | 4/2001 | Gonsalves et al. | |
| 6,587,345 B2 * | 7/2003 | Chu et al. | 361/719 |
| 6,595,270 B2 | 7/2003 | Machiroutu et al. | |
| 6,778,393 B2 | 8/2004 | Messina et al. | |
| 6,867,973 B2 | 3/2005 | Chang | |
| 6,970,355 B2 | 11/2005 | Ellsworth, Jr. et al. | |
| 7,167,366 B2 * | 1/2007 | Cheon | 361/699 |
| 7,515,418 B2 | 4/2009 | Straznicky et al. | |
| 7,624,791 B2 | 12/2009 | Strobel et al. | |
| 7,652,884 B2 | 1/2010 | Suzuki et al. | |
| 2005/0180107 A1 * | 8/2005 | Naganawa et al. | 361/699 |
| 2006/0261469 A1 | 11/2006 | Ni et al. | |
| 2007/0000655 A1 | 1/2007 | Uchida et al. | |
| 2007/0091570 A1 * | 4/2007 | Campbell et al. | 361/699 |
| 2009/0108429 A1 | 4/2009 | Tsao et al. | |
| 2012/0080785 A1 | 4/2012 | Johnson et al. | |

FOREIGN PATENT DOCUMENTS

| | | |
|---|---|---|
| JP | 61226946 | 10/1986 |
| JP | 62118553 | 5/1987 |
| WO | 2010096355 A2 | 8/2010 |
| WO | 2011017385 A1 | 2/2011 |
| WO | 2011038184 A1 | 3/2011 |
| WO | 2011044445 A1 | 4/2011 |

* cited by examiner

SEMICONDUCTOR COOLING APPARATUS

RELATED APPLICATIONS

The present application claims priority to U.S. Provisional Patent Application No. 61/619,153, filed Apr. 2, 2012, which is incorporated in its entirety herein by reference.

GOVERNMENT SUPPORT

The invention was supported, in whole or in part, by a grant, Contract No. FA8650-04-G-0002-0001 from the U.S. Air Force. The U.S. Government may have certain rights in the invention.

BACKGROUND

A flat aluminum brazed monolithic cooling apparatus can be used with highly conformal low thermal performance heat spreaders, such as a gap pad or gap filler material, to accommodate vertical height variations in semiconductors and individual variations in planarity with respect to the cooling apparatus surface. After the individual semiconductors are attached to an array, the semiconductor height variations can be mapped for the entire array in order to select custom heat spreaders for each semiconductor element. This solution, generally, is effective for planar arrays, but, generally, this solution is not effective for semiconductor arrays with various vertical height variations due to the inefficiency of the heat spreaders and the difficulties of accurately mapping and fitting the custom heat spreaders. Thus, a need exists in the art for a semiconductor cooling apparatus with the features as described herein.

SUMMARY

One approach to a semiconductor cooling apparatus includes a thermal assembly configured to thermally couple to an array of semiconductor elements. The assembly includes a plurality of heat exchangers configured to transfer heat from the semiconductor elements to coolant flowing through the heat exchangers. The assembly also includes a plurality of supply flexible runners and return flexible runners, a supply flexible runner coupled to each heat exchanger for providing coolant to the respective heat exchanger and a return flexible runner coupled to each heat exchanger for exhausting returned coolant from the respective heat exchanger, each flexible runner flexing to conform to a height of a respective semiconductor element and apply a force to the respective heat exchanger to maintain contact of the heat exchanger with the respective semiconductor element. The assembly also includes a manifold coupled to the plurality of supply flexible runners and the plurality of return flexible runners, the manifold for supplying coolant to the supply flexible runners and for exhausting returned coolant received from the return flexible runners.

Any of the approaches described herein can include one or more of the following examples. In some examples, the manifold has an input that is coupled to a coolant supply line and an output that is coupled to a coolant return line. In some examples, the assembly includes a coolant chilling apparatus coupled to the coolant supply line and the coolant return line and configured to chill coolant, and also includes a coolant pump configured to pump the coolant between the coolant chilling apparatus and the thermal assembly.

In some examples, the plurality of supply and return flexible runners are located over the heat exchangers. In some examples, the manifold is located over the plurality of supply and return flexible runners. In some examples, a spring constant of each flexible runner is defined based on one or more of wall thickness of the respective flexible runner, material type of the respective flexible runner, or a geometric property of the respective flexible runner. In some examples, the apparatus includes aluminum, copper, stainless steel, titanium, alloys thereof, plastic, semiconductor fabrication materials, or any combination thereof.

In some examples, each heat exchanger is coupled to a respective semiconductor element as a packaging lid or packaging body for the respective semiconductor element.

Another approach to a semiconductor cooling apparatus includes a thermal assembly configured to thermally couple to a semiconductor element. The assembly includes a heat exchanger configured to transfer heat from the semiconductor element to coolant flowing through the heat exchanger. The assembly also includes at least one flexible runner coupled to the heat exchanger for providing coolant to the heat exchanger and for exhausting returned coolant from the heat exchanger, the at least one flexible runner flexes to conform to a height of the semiconductor element and apply a force to the heat exchanger to maintain contact of the heat exchanger with the semiconductor element. The assembly also includes a manifold coupled to the at least one flexible runner for supplying coolant to the at least one flexible runner and for exhausting returned coolant received from the at least one flexible runner.

In some examples, the at least one flexible runner includes a supply conduit and a return conduit within the at least one flexible runner, where the supply conduit provides coolant to the heat exchanger and the return conduit exhausts returned coolant from the heat exchanger. In some examples, the thermal assembly includes at least one supply flexible runner and at least one return flexible runner, where the at least one supply flexible runner provides coolant to the heat exchanger and the at least one return flexible runner exhausts returned coolant from the heat exchanger.

In some examples, the manifold has an input that is coupled to a coolant supply line and an output that is coupled to a coolant return line. In some examples, the apparatus includes a coolant chilling apparatus coupled to the coolant supply line and the coolant return line and configured to chill coolant, and a coolant pump configured to pump the coolant between the coolant chilling apparatus and the thermal assembly.

In some examples, the at least one flexible runner is located over the heat exchanger. In some examples, the manifold is located over the at least one flexible runner. In some examples, a spring constant of the flexible runner is defined based on one or more of wall thickness of the flexible runner, material type of the flexible runner, or a geometric property of the flexible runner. In some examples, the heat exchanger is coupled to the semiconductor element as a packaging lid for the semiconductor element.

Another approach to a semiconductor cooling apparatus includes a thermal assembly configured to thermally couple to an array of semiconductor elements. The assembly includes a plurality of heat exchangers configured to transfer heat from the semiconductor elements to coolant flowing through the heat exchangers. The assembly also includes a flexible manifold for supplying coolant to the heat exchangers and for exhausting returned coolant received from the heat exchangers, where the flexible manifold flexes to conform to a height of a stackup of each semiconductor element, and a respective heat exchanger, to apply a force to the stackup to maintain contact of the heat exchanger with the respective semiconductor element. In some examples, the manifold is located over the heat exchangers.

Another approach to a semiconductor cooling apparatus includes a thermal assembly configured to thermally couple to a semiconductor element. The assembly includes a heat exchanger configured to transfer heat from the semiconductor element to coolant flowing through the heat exchanger. The assembly also includes a flexible manifold for supplying coolant to the heat exchanger and for exhausting returned coolant received from the heat exchanger, where the flexible manifold flexes to conform to a height of a stackup of the semiconductor element and the heat exchanger, to apply a force to the stackup to maintain contact of the heat exchanger with the semiconductor element.

Another approach to a cooling apparatus includes a thermal assembly configured to thermally couple to an array of objects. The assembly includes a plurality of heat exchangers configured to transfer heat from the objects to coolant flowing through the heat exchangers. The assembly also includes a plurality of supply flexible runners and return flexible runners, a supply flexible runner coupled to each heat exchanger for providing coolant to the respective heat exchanger and a return flexible runner coupled to each heat exchanger for exhausting returned coolant from the respective heat exchanger, each flexible runner flexing to conform to a height of a respective object and apply a force to the respective heat exchanger to maintain contact of the heat exchanger with the respective object. The assembly also include a manifold coupled to the plurality of supply flexible runners and the plurality of return flexible runners, the manifold for supplying coolant to the supply flexible runners and for exhausting returned coolant received from the return flexible runners.

The cooling methods and systems described herein (hereinafter "technology") can provide one or more of the following advantages. One advantage of the technology is that the flexibility in the cooling apparatus advantageously increases the heat transfer between the semiconductor element and the cooling apparatus, thereby extending the life of the semiconductor element by promoting proper cooling of the semiconductor element. The flexibility of the cooling apparatus advantageously reduces the installation time and cost by removing any needed individual customizations due to, for example, differences in height of semiconductor elements or mechanical assembly tolerances, thereby decreasing the overall cost of the devices associated with the semiconductor element while increasing the heat transfer. The compact geometry of the cooling apparatus components advantageously allows for tighter spacing between semiconductor elements and/or other components of the devices associated with the semiconductor elements.

BRIEF DESCRIPTION OF THE DRAWINGS

The foregoing and other objects, features and advantages will be apparent from the following more particular description of the embodiments, as illustrated in the accompanying drawings in which like reference characters refer to the same parts throughout the different views. The drawings are not necessarily to scale, emphasis instead being placed upon illustrating the principles of the embodiments.

DETAILED DESCRIPTION

Semiconductor elements, such as a ball grid array (BGA), can be used as part of aerospace sensor architectures and/or other semiconductor architectures. In most instances, each of the semiconductor elements is soldered to a primary circuit board (e.g., motherboard, array, etc.) creating the semiconductor array. Due to the size, spacing, and thermal properties of the semiconductor elements on the array, a semiconductor cooling apparatus is needed to quickly and efficiently transfer heat from the array. However, each element in the semiconductor array can have different packaging and manufacturing tolerances, making it difficult to effectively transfer heat from each element.

Thus, the semiconductor cooling apparatus, as described herein, includes thermal assemblies, where each thermal assembly can be configured to thermally couple to semiconductor elements having different height stackups. Advantageously, each cooling element of a thermal assembly can independently flex to conform to the height of a respective semiconductor element (e.g., a math coprocessor is 0.02 inches high and a video processor is 0.04 inches high, an input/output processor is 0.023 inches high and an encryption processor is 0.034 inches high, etc.), thereby increasing the thermal transfer between the semiconductor elements and the thermal assemblies.

Figure 1:
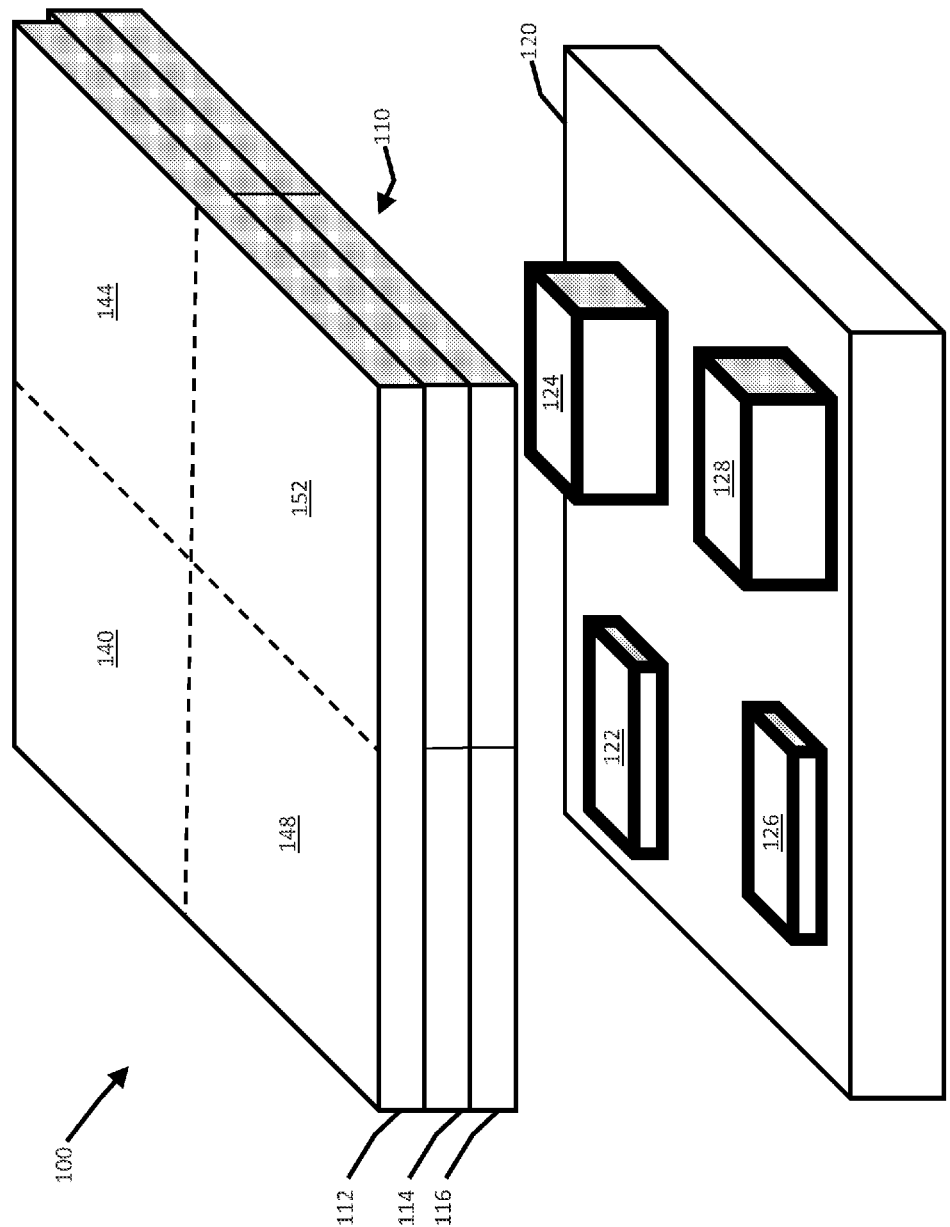
FIG. 1 is a block diagram of an exemplary semiconductor cooling apparatus and semiconductor array.

FIG. 1 is a block diagram 100 of an exemplary semiconductor cooling apparatus 110 and semiconductor array 120 (e.g., ball grid array (BGA), computer motherboard, etc.). The semiconductor cooling apparatus 110 includes a plurality of cooling elements 140, 144, 148, and 152. The semiconductor array 120 includes a thermal assembly that has semiconductor elements of various heights, widths, and lengths 122, 124, 126, and 128. Each cooling element 140, 144, 148, and 152 of the semiconductor cooling apparatus 110 is configured to thermally couple (e.g., positioned near each other to enable thermal transfer, positioned near each other to maximize thermal transfer, etc.) to a respective semiconductor element 122, 124, 126, and 128 of the array of semiconductor elements 120. The cooling apparatus 110 includes a plurality of heat exchangers 116, a plurality of flexible runners 114, and a manifold 112, described further in detail below.

As illustrated in FIG. 1, at least two of the semiconductor elements 122, 124, 126, and 128 have a different height (e.g., with respect to the top of the semiconductor mounting surface, with respect to the bottom of the semiconductor cooling apparatus 110, with respect to each other, etc.). In operation, each cooling element 140, 144, 148, and 152 independently flexes to conform to the height of the respective semiconductor element 122, 124, 126, and 128, respectively (e.g., the cooling elements flex from 0.001 to 0.009 inches, the cooling elements flex from 0.01 to 0.09 inches, etc.). For example, the cooling element 140 flexes independently from the other cooling elements 144, 148, and 152 to conform to the height of the semiconductor element 122.

The independent flexibility of each cooling element advantageously increases the heat transfer between the semiconductor element and the cooling element, thereby extending the life of the semiconductor element by promoting proper cooling of the semiconductor element. The independent flexibility of each cooling element advantageously reduces the installation time and cost by removing any needed individual customizations, thereby decreasing the overall cost of the devices associated with the semiconductor element while increasing the heat transfer.

In some examples, the flexible properties of each cooling element 140, 144, 148, and 152 reduces a thermal resistance interface between the cooling element 140, 144, 148, and 152 and the respective semiconductor element 122, 124, 126, and 128. For example, the cooling element 140 flexes 0.030 inches to be in contact with the respective semiconductor element 122, and the cooling element 144 flexes 0.002 inches to be in contact with the respective semiconductor element 124. The independent flexibility of each cooling element 140, 144, 148, and 152 advantageously enables the thermal resistance interface to be reduced (e.g., reduced thermal penalty from 20° C. to 10° C.; reduced thermal penalty from 8° C. to 3.2° C., etc.), thereby increasing the efficiency of the semiconductor cooling apparatus and increasing the life of the semiconductor elements.

In some examples, the semiconductor cooling apparatus can be produced using aluminum, copper, stainless steel, titanium, alloys thereof, and/or material with high heat transfer (e.g., Glidcop® available from SCM Metal Products, Inc., a copper alloy, etc.). In some examples, the semiconductor cooling apparatus can be produced using plastic material or semiconductor fabrication materials (e.g., silicon).

Figure 2:
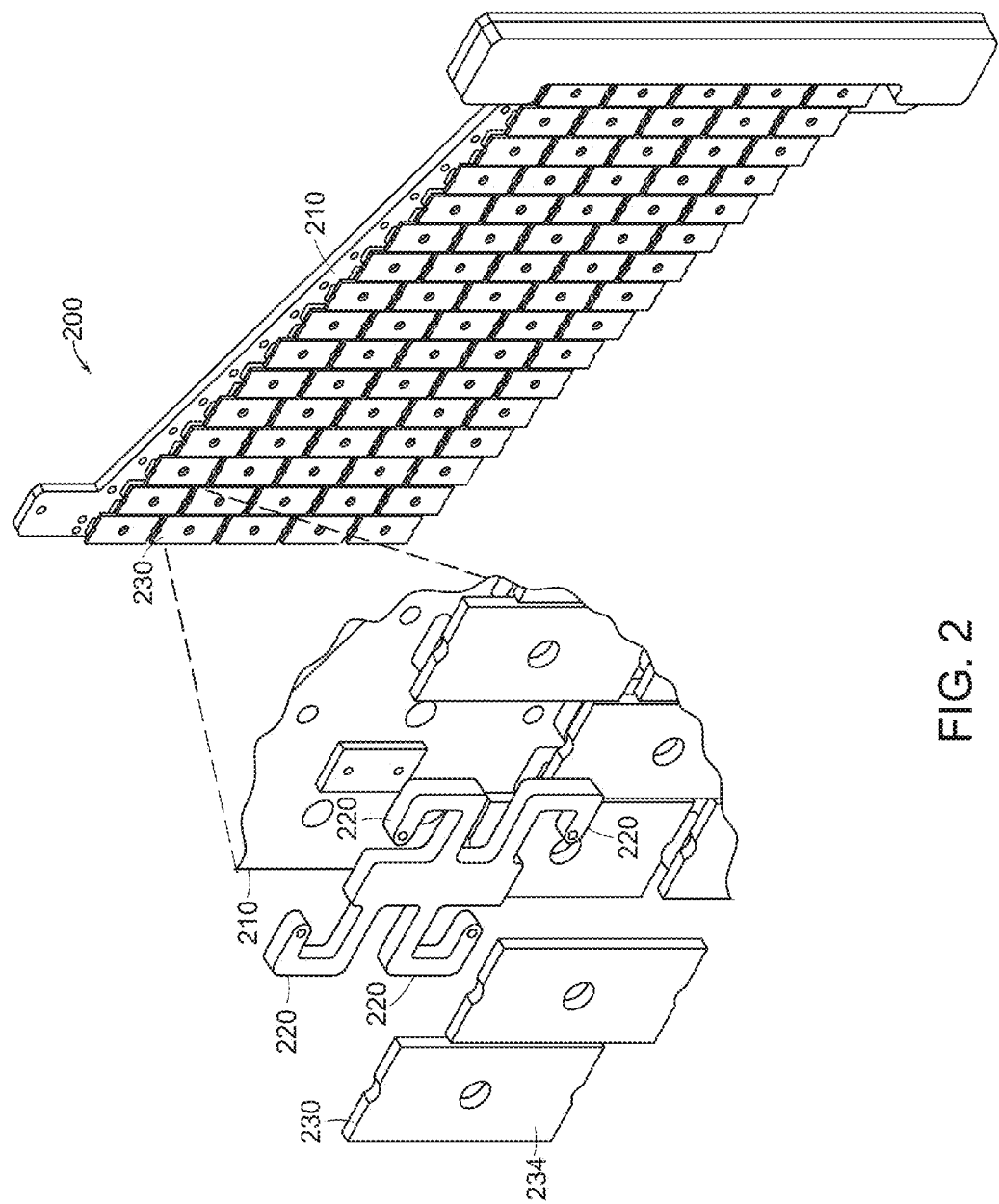
FIG. 2 is an illustration of another exemplary semiconductor cooling apparatus.

FIG. 2 is an illustration of another exemplary semiconductor cooling apparatus 200. The cooling apparatus 200 includes a thermal assembly that has a plurality of heat exchangers 230, a plurality of flexible runners 220, and a manifold 210. When installed, a surface 234 of each heat exchanger 230 is coupled to, or otherwise in contact with, a corresponding surface on a semiconductor element (e.g., element 122 of FIG. 1). The heat exchangers 230 are configured to transfer heat from the semiconductor elements to coolant flowing through the heat exchangers 230.

The flexible runners 220 are coupled to a respective heat exchanger 230 for providing coolant to the respective heat exchanger 230. The flexible runners 220 also exhaust returned coolant (e.g., heated coolant) from the heat exchangers 230. The flexible runners 220 flex to conform to a height of a respective semiconductor element in contact with a respective heat exchanger 230 and apply a force to the heat exchanger 230 to maintain contact of the heat exchanger 230 with the semiconductor element.

The manifold 210 of the cooling apparatus 200 is coupled to the plurality of flexible runners 220. The manifold 210 supplies coolant to the flexible runners 220 and exhausts returned coolant from the flexible runners 220. In this embodiment, the manifold 210 is a unitary body that provides coolant to, and exhausts returned coolant from, each of the plurality of flexible runners 220 and heat exchangers 230. In some embodiments, the manifold 210 includes a plurality of manifolds, where a manifold provides coolant to a subset of the flexible runners and heat exchangers and also exhausts returned coolant from the subset of flexible runners.

Although FIG. 2 illustrates the heat exchangers 230 as having a generally rectangular shape and the flexible runners having a particular circuitous shape, alternate examples of these components of the semiconductor cooling apparatus 200 can have different shapes and/or relative dimensions. For example, the semiconductor cooling apparatus could include heat exchangers having square or circular shapes.

Figure 3:
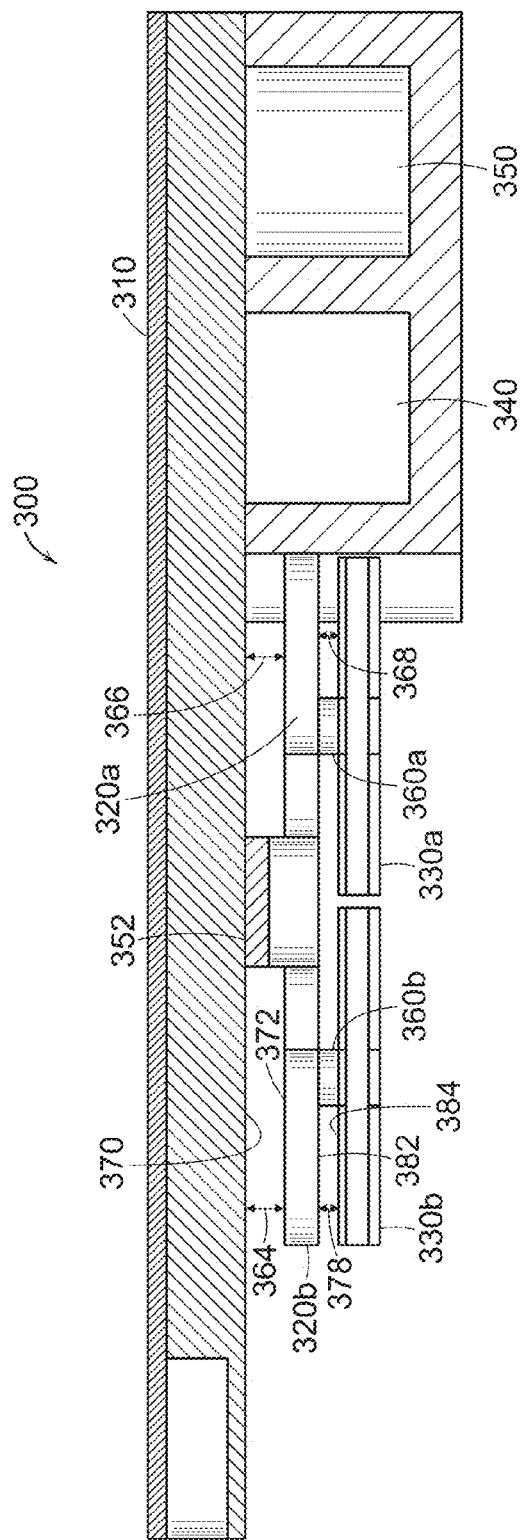
FIG. 3 is an illustration of another exemplary semiconductor cooling apparatus.

FIG. 3 is a cross-sectional view of another exemplary cooling apparatus 300. The apparatus 300 includes a manifold 310 that has an input 340 and an output 350. The input 340 is coupled to a coolant supply line (not shown) that provides coolant to the manifold 310. The output 350 is coupled to a coolant return line (not shown) that exhausts returned coolant (e.g., coolant that has been heated in the heat exchanger).

Internal passages in the manifold 310 are used to transport the coolant to and from the flexible runners 320a and 320b (generally 320). The flexible runners 320 are coupled to the heat exchangers 330a and 330b (generally 330). The cooling apparatus 300 also includes several risers 352, 360a, and 360b that maintain gaps between the different components of the cooling apparatus 300 so the flexible runners are able to conform to the different heights of the semiconductor elements (not shown) and apply force to heat exchangers in contact with the semiconductor elements. Riser 352 sets gaps 364 and 366 between a surface 370 of the manifold 310 and a surface 372 of the flexible runners 320a and 320b, respectively. The gaps 364 and 366 are shown as being the same size; however, the gaps will not necessarily be the same. The two gaps may have different sizes; depending on, for example, the relative heights of semiconductor elements contacting the heat exchangers abutting the flexible runners. Risers 360a and 360b set gaps 368 and 378 between a surface 382 of the flexible runners 320 and a surface 384 of the heat exchangers 330. Again, the gaps 368 and 378 are shown as being the same size; however, the gaps will not necessarily be the same. The two gaps may have different sizes; depending on, for example, the relative heights of semiconductor elements contacting the heat exchangers abutting the flexible runners.

The risers 352, 360a, and 360b also carry coolant through interior passages in the risers. The manifold 310 provides coolant to the flexible runners 320 via the interior passages of riser 352. Returned fluid coming from the flexible runners 320 is also exhausted through an interior passage of riser 352 to the manifold 310 to be subsequently exhausted from the manifold via output 350. Flexible runner 320a provides coolant to heat exchanger 330a via interior passages in the riser 360a, and heat exchanger 330a exhausts returned coolant to the flexible runner 320a via a different interior passage of riser 360a. Similarly, flexible runner 320b provides coolant to heat exchanger 330b via interior passages in the riser 360b, and heat exchanger 330b exhausts returned coolant to the flexible runner 320b via a different interior passage of riser 360b.

Figure 4:
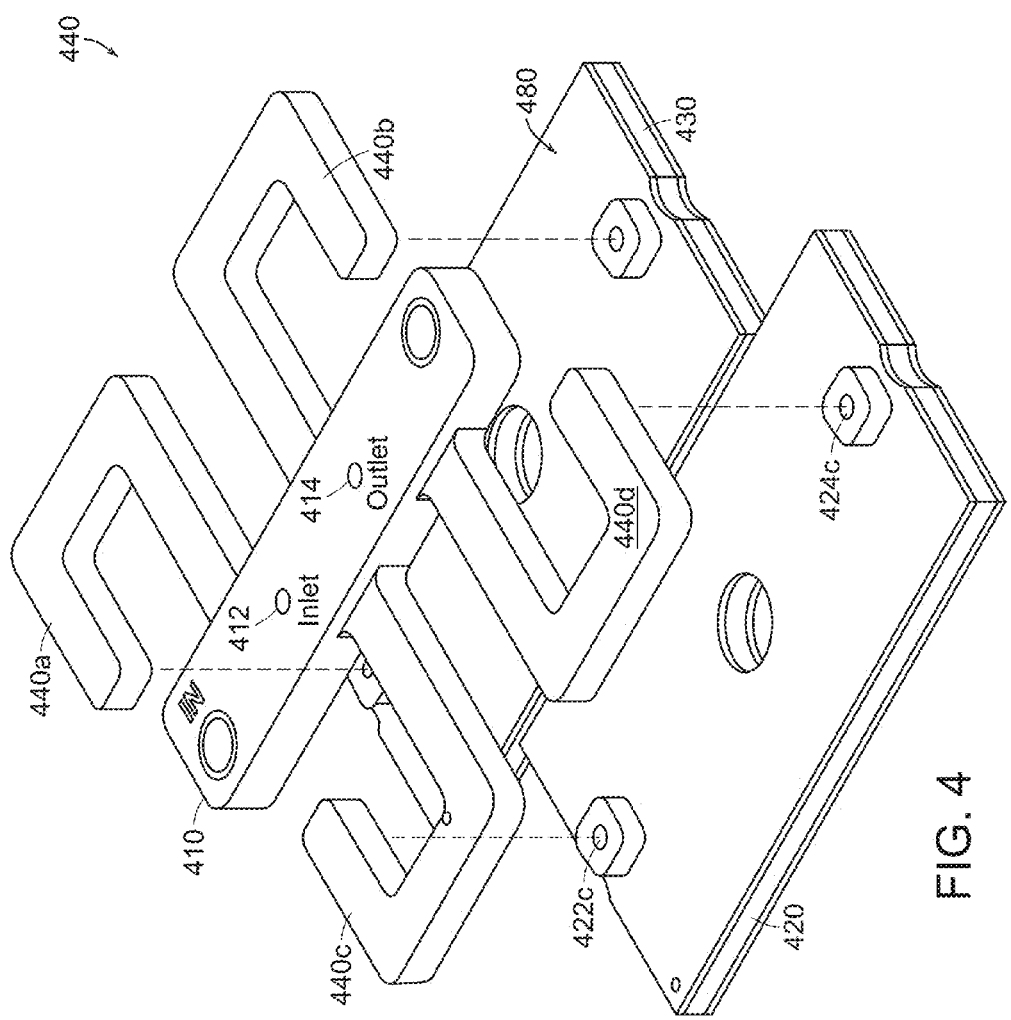
FIG. 4 is a view of exemplary heat exchangers and flexible runners of a cooling apparatus.

FIG. 4 is a view of exemplary heat exchangers 420 and 430 and flexible runners 440a, 440b, 440c, and 440d (generally 440) of a cooling apparatus. The flexible runners 440 are united by a central body 410; however, in some embodiments, no central body is required. As shown in FIG. 4 (and FIGS. 5A and 5B) each of the flexible runners 440 extends from the central body in a J-shaped pattern The flexible runner body 410 has an inlet 412 and an outlet 414. The flexible runner body 410 includes markings that identify the inlet and outlet (marked, as "inlet" and "outlet", respectively). The markings can be made using, for example, indelible ink or they can be etched. Additional markings can be used in this embodiment, and other embodiments, to identify the function, orientation, or how various components should be assembled for proper use. Coolant is supplied to the inlet 412 by a manifold (e.g., the manifold 210 of FIG. 2). Coolant flows through the interior of the flexible runners 440. For example, in this embodiment, coolant enters inlet 412 and then flows through supply flexible runner 440c and supply flexible runner 440a. Supply flexible runner 440c provides coolant to inlet 422c of heat exchanger 420. The heat exchangers 420 and 430 are shown with a face sheet 480 that seals the heat exchangers, therefore, the interior structure of the exemplary heat exchangers are not visible. The coolant flows through the interior passages of the heat exchanger 420 and exits the heat exchanger 420 at outlet 424c. The returned coolant exiting outlet 424c enters an inlet of return flexible runner 440d. The coolant flows through the return flexible runner 440d to the central body 410 where it then exits outlet 414. The returned coolant exiting outlet 414 is provided to the manifold.

Figure 5A:
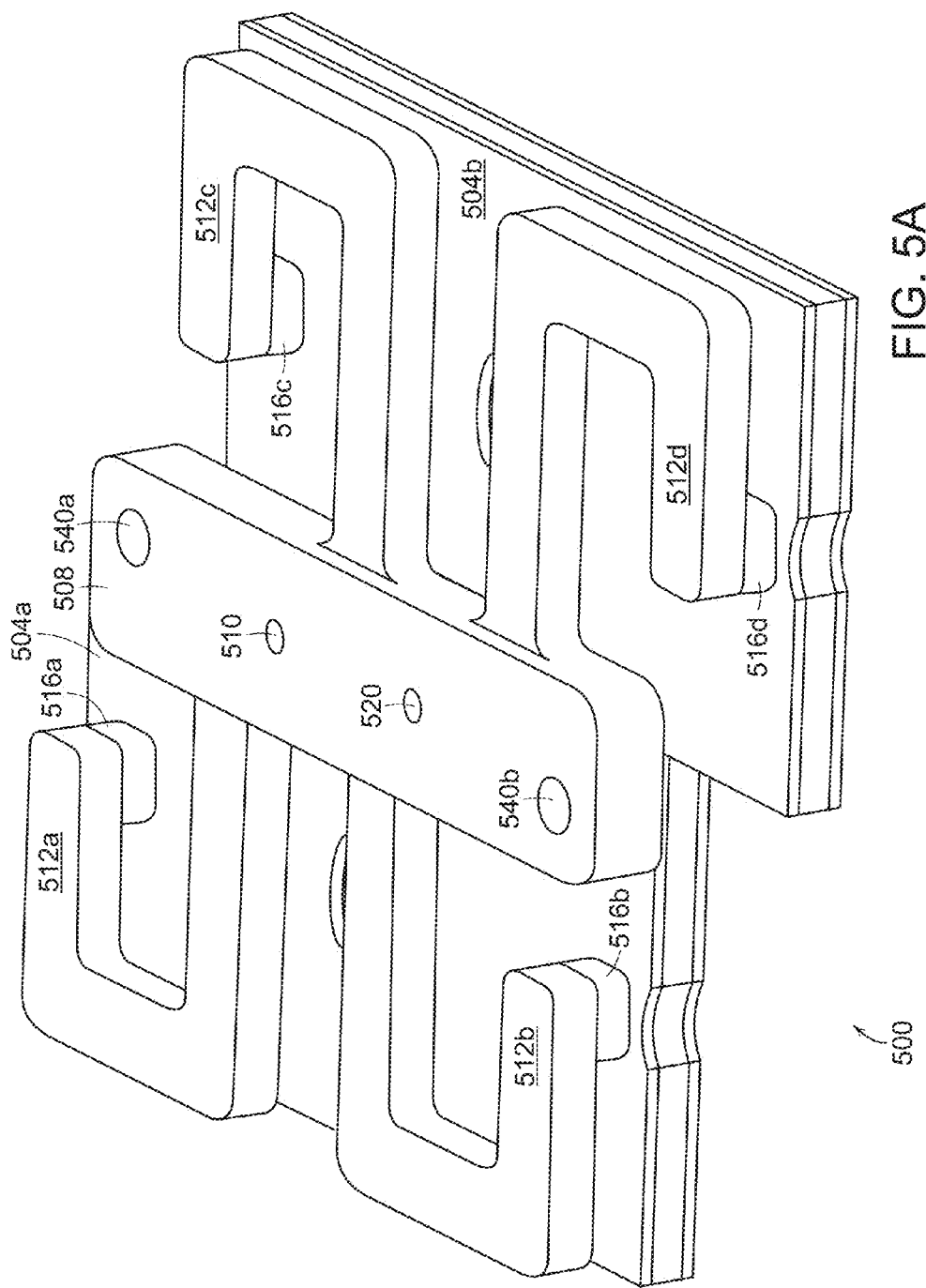
FIG. 5A is an illustration of heat exchangers and flexible runners of another exemplary semiconductor cooling apparatus.

FIG. 5A is an illustration of another exemplary assembly 500 of flexible runners and heat exchangers for a semiconductor cooling apparatus. The assembly 500 includes two heat exchangers 504a and 504b (generally 504). The assembly 500 also includes a flexible runner assembly 508 that includes four flexible runners 512a, 512b, 512c, and 512d (generally 512). The assembly 500 also includes four risers 516a, 516b, 516c, 516d (generally 516) that establish a gap between the heat exchangers 504 and the flexible runners 512, similarly as described previously with respect to FIG. 3. The risers 516 are attached to the heat exchangers 504 and have holes through the body of the risers 516 that couple fluid passages in the flexible runners 512 to fluid passages within the heat exchangers 504. In some embodiments, the risers are attached or otherwise installed on the heat exchangers, flexible runners and/or manifolds.

The assembly 500 also includes two thru-holes 540a and 540b in the flexible runner assembly 508. Screws (not shown) are inserted through the thru-holes 540a and 540b and screwed into corresponding threaded holes in the manifold (not shown). The flexible runners 512 are coupled to the risers 516 by diffusion bonding or some other suitable bonding or attachment method (e.g., friction welding, brazing, adhesive bonding or by screws). By coupling the flexible runner assembly 508 to the heat exchangers 504, a fluid seal is formed between the flexible runners 512, the risers 516 and the heat exchangers 504, thereby creating a sealed fluid path between the three components. In some embodiments, the interfaces between the three components include o-rings, adhesive, or any other suitable material to create fluid seals to contain the coolant within the components during use.

The assembly 500 also includes an inlet 510 and outlet 520 in the flexible runner assembly 508. The inlet 510 receives coolant supplied by a manifold (not shown), for example, the manifold 310 of FIG. 3. Coolant flows into the inlet 510 and through the supply flexible runner 512a where it is passed to the heat exchanger 504a. The coolant flowing through the heat exchanger 504a absorbs the heat of a semiconductor element in contact with the heat exchanger 504a. The heated coolant is then returned by exhausting the returned coolant from the heat exchanger 504a to the return flexible runner 512b. The return flexible runner 512b then conveys the returned coolant to the outlet 520 where it is exhausted to the manifold. A similar process occurs with flexible runners 512c, 512d, and heat exchanger 504b.

Figure 5B:
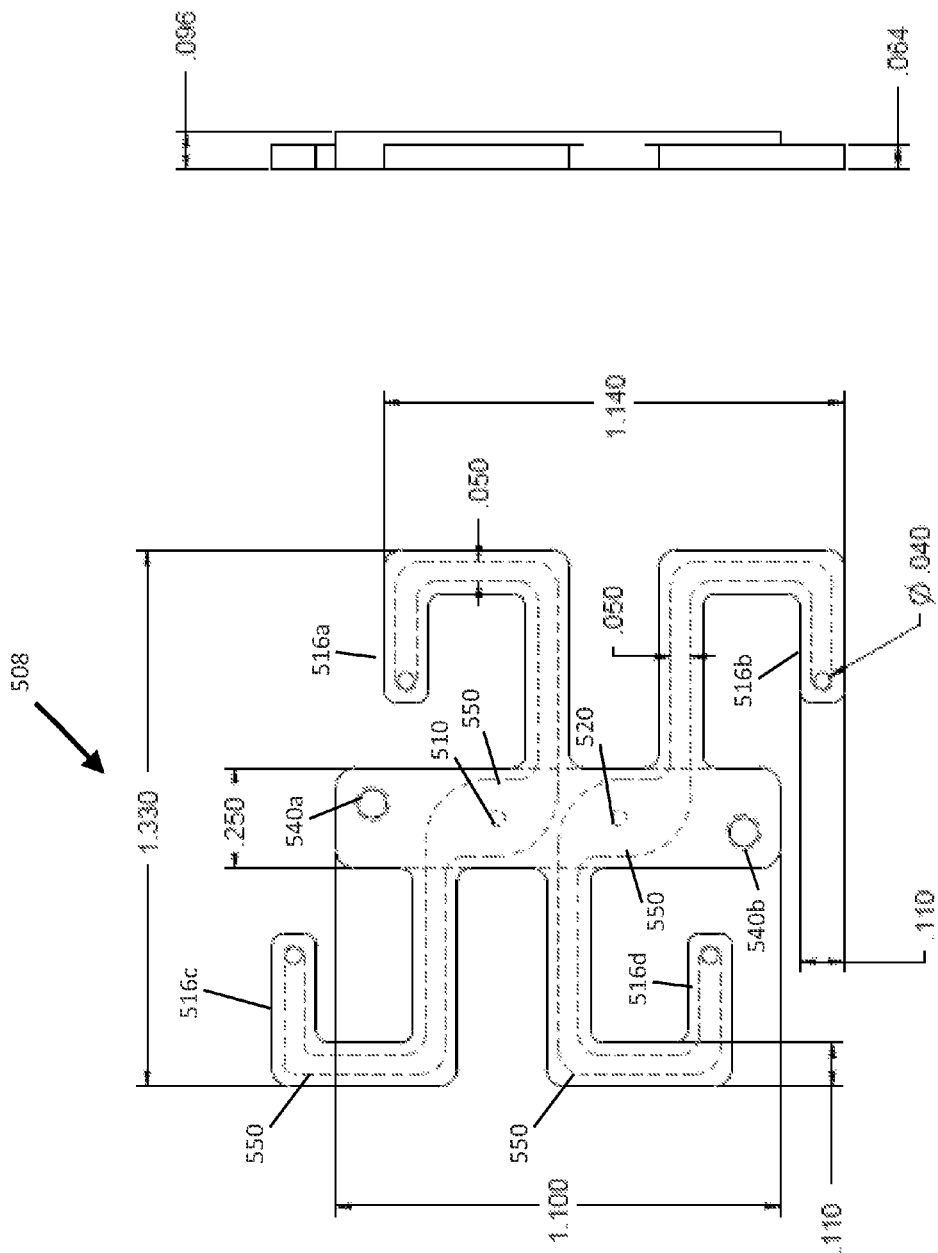
FIG. 5B is an illustration of the flexible runners of FIG. 5A.

FIG. 5B is an illustration of the flexible runner assembly 508 of FIG. 5A. The figures depict the interior passages 550 within the flexible runners 512 that supply coolant to the heat exchangers 504 and exhaust returned coolant from the heat exchangers 504. The force generated by a flexible runner to a heat exchanger 504 can be varied based on one or more of a variety of design parameters. If the deformation of a flexible runner is elastic, the force is a function of the spring constant of the flexible runner 512 and the displacement of the flexible runner 512 (e.g., in accordance with $F=kx$, where F is the force, k is the spring constant, and x is the displacement). The spring constant can be changed or specified based on, for example, the material type of the flexible runner 512, the wall thickness of the flexible runner 512, or another geometric property of the flexible runner 512 (e.g., length, width, thickness). In some embodiments, the runners 512 may be designed for plastic deformation instead of elastic deformation.

Figure 6:
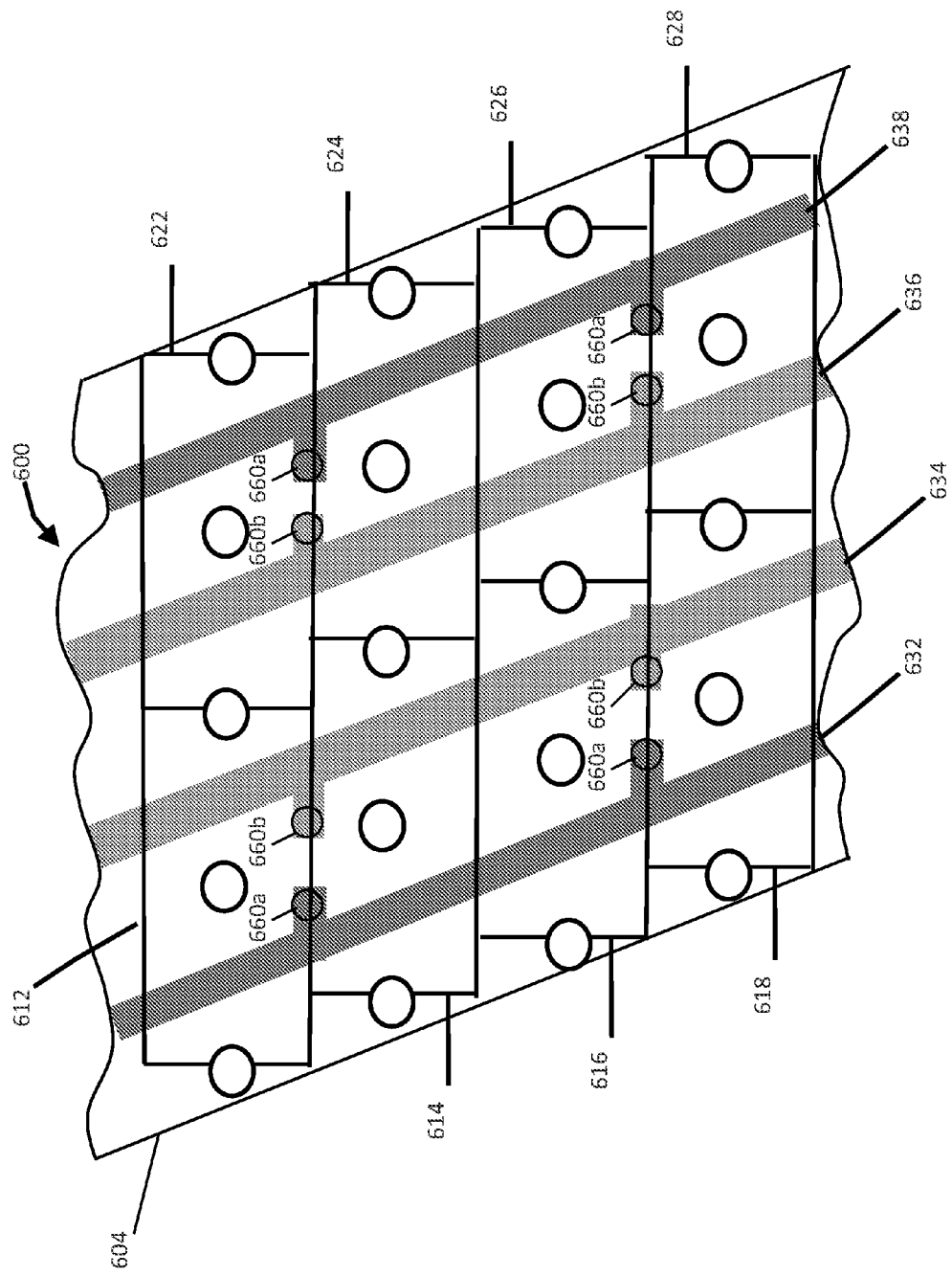
FIG. 6 is an illustration of an exemplary coolant flow path in a semiconductor cooling apparatus.

FIG. 6 is an illustration 600 of a portion of exemplary coolant flow paths in a manifold 604 of a semiconductor cooling apparatus (e.g., the manifold 210 of cooling apparatus 200), where the flow paths are shown superimposed over the heat exchangers. The figure shows eight heat exchangers 612, 614, 616, 618, 622, 624, 626, and 628. Four fluid paths 632, 634, 636, and 638 are depicted. The flexible runners (e.g., flexible runners 220) of the cooling apparatus are omitted for clarity of illustration purposes. Fluid paths 632 and 638 are coolant supply paths, and fluid paths 634 and 636 are coolant return paths. Coolant from the manifold 604 would enter the inlet of the flexible runner assembly (e.g., flexible runner assembly 508 of FIGS. 5A and 5B) at location 660a. Coolant returning from the heat exchangers would exit the flexible runner assembly at locations 660b.

Figure 7:
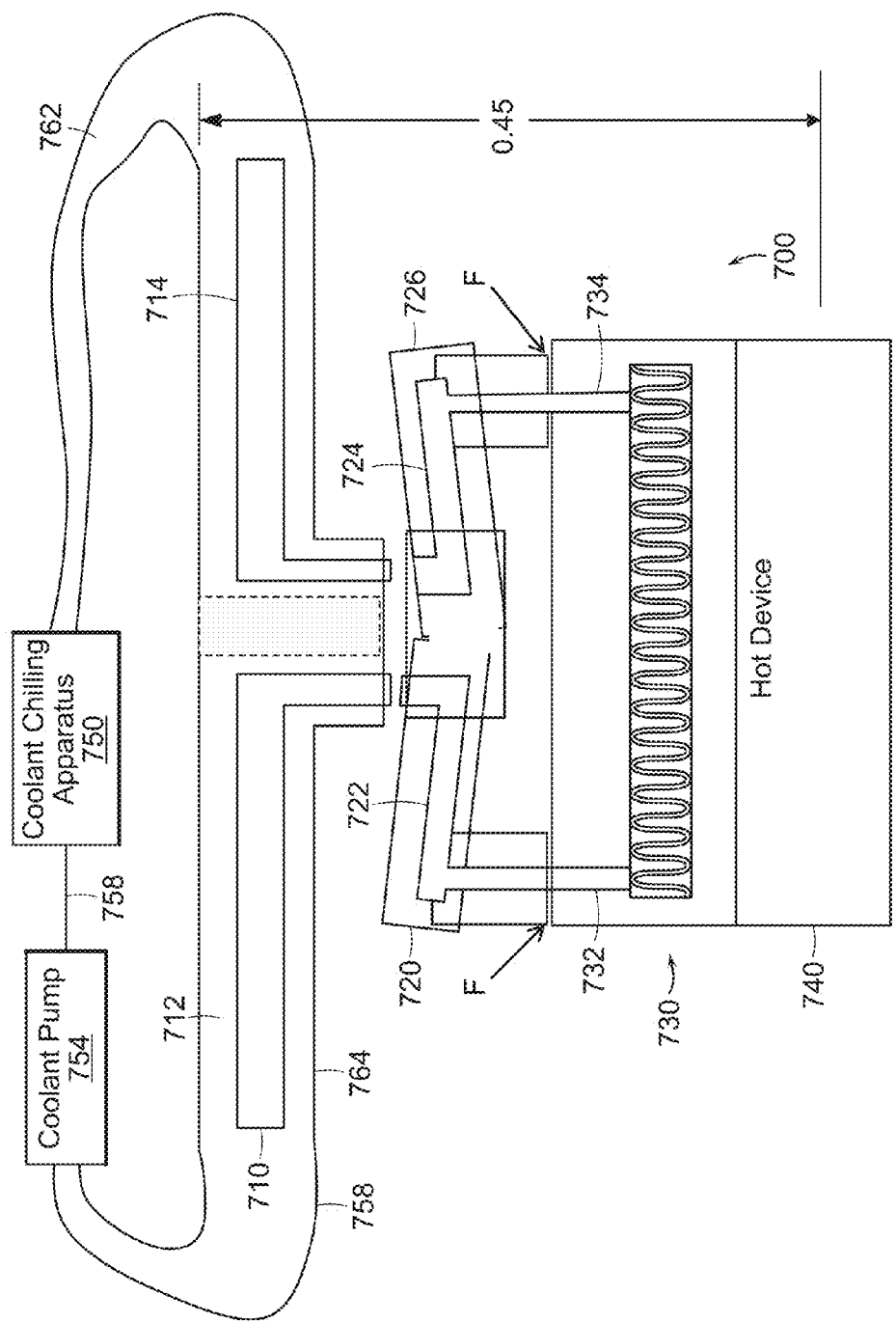
FIG. 7 is a cross-sectional view of an assembled semiconductor cooling apparatus, according to an illustrative embodiment.

FIG. 7 is a cross-sectional, schematic illustration of an exemplary assembled semiconductor cooling apparatus 700 for cooling a semiconductor element 740. The cooling apparatus 700 includes a coolant chilling apparatus 750 coupled to one or more coolant supply lines 758 and one or more coolant return lines 762. The coolant chilling apparatus 750 is configured to chill coolant. The apparatus 700 also includes a coolant pump 754 that is configured to pump the coolant through the supply lines and various coolant passages in the cooling apparatus 700. The pump 754 pumps chilled coolant through the coolant supply line 758 which is directed to an input 764 of the manifold 712. The chilled coolant is pumped through coolant supply passages 710 in the manifold 712. The chilled coolant is delivered to passages 722 in one or more supply flexible runners 720. In some examples, the coolant includes single phase or two-phase coolants (e.g., where the liquid coolant evaporates in the heat exchanger). In some examples, the coolant includes single phase liquids (e.g., polyalphaolefin (PAO), Coolanol, water, glycol water mixtures (EGW, PGW), fuels (JP-5, JP-8)) and/or two-phase coolants (water, ammonia, methanol, Fluorinert, glycol water mixtures (EGW, PGW)).

The manifold 712, flexible runners 720 and 726, and heat exchanger 730 are shown in assembled form such that the flexible runners 720 and 726 are flexed to apply a force (F) to the heat exchanger 730 to maintain contact of the heat exchanger 730 with the semiconductor element 740. The flexibility of the flexible runners 720 and 726 enables the runners to conform to height differentials in the stack up of components, including the semiconductor element 740. In this embodiment, the heat exchanger 730 also acts as a packaging lid for the semiconductor element 740.

The chilled coolant is then delivered to passages 732 in one or more heat exchangers 730. Heat from the semiconductor element 740 is transferred to the coolant flowing through the heat exchanger 730. Heated coolant is then exhausted by the heat exchanger 730 through one or more passages 734 in the heat exchanger 730 to passages 724 in one or more return flexible runners 726. The exhausted coolant is delivered to one or more coolant return passages 714 in the manifold 712. The exhausted coolant is then pumped through one or more coolant return lines 762 to the coolant chilling apparatus where the coolant is chilled and reused in the apparatus 700.

This embodiment includes two flexible runners 720 and 726; however, in some embodiments, the cooling apparatus only includes one or more flexible runners. In embodiments with a single flexible runner, the flexible runner is still coupled to the manifold 712 and a single heat exchanger 730. To both supply coolant to the heat exchanger as well as exhaust returned coolant from the heat exchanger, the single flexible runner includes both a supply conduit or passage as well as a return conduit or passage within the body of the flexible runner. The supply conduit of the single flexible runner receives coolant from the coolant supply passage 710 in the manifold 712, and delivers the coolant to heat exchanger 730. The return conduit of the single flexible runner receives returned coolant from the heat exchanger 730 and delivers the returned coolant to the coolant return passage 714 in the manifold 712.

Figure 8:
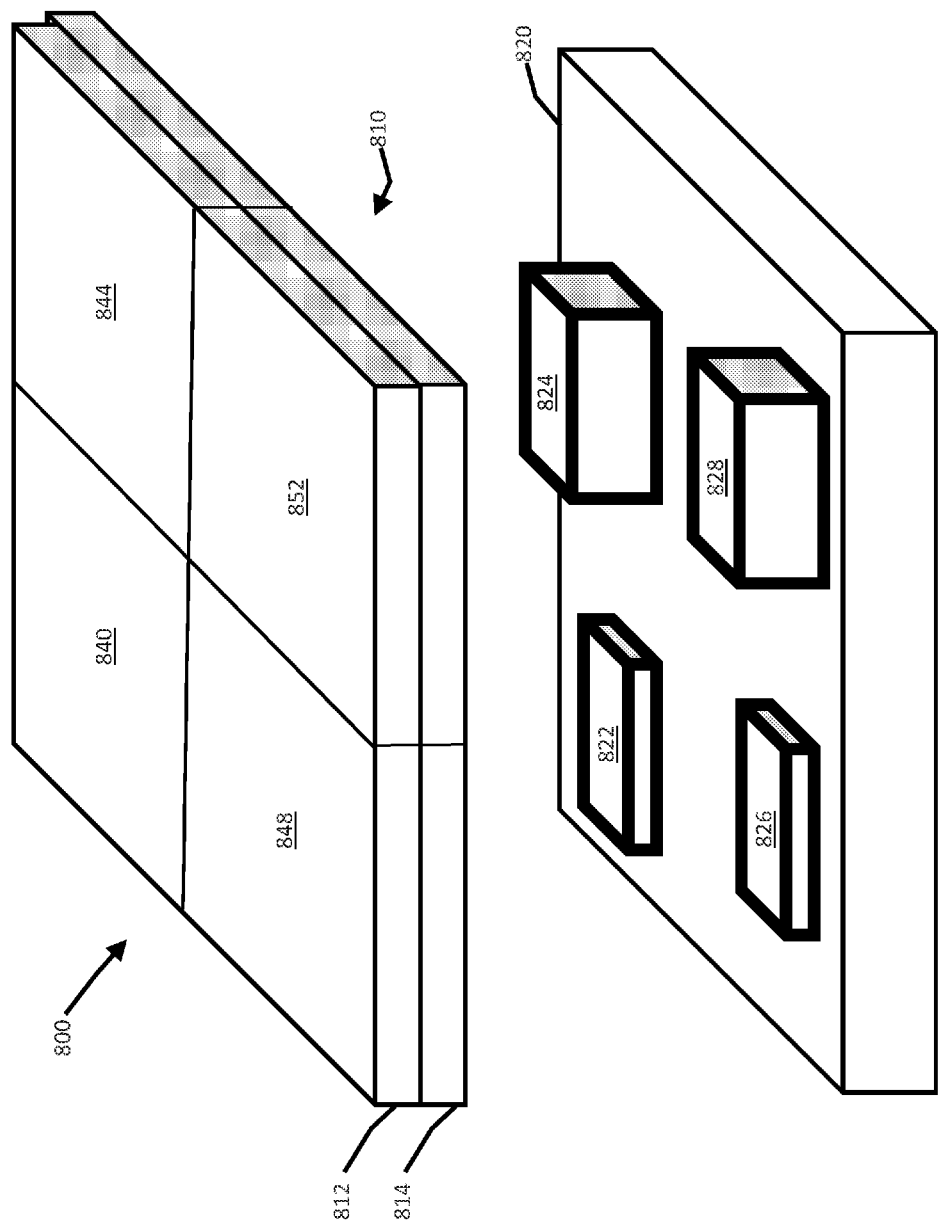
FIG. 8 is a block diagram of an exemplary semiconductor cooling apparatus and semiconductor array.

FIG. 8 is a block diagram 800 of an exemplary semiconductor cooling apparatus 810 and semiconductor array 820 (ball grid array (BGA), computer motherboard, etc.). The semiconductor cooling apparatus 810 includes a thermal assembly that has a plurality of cooling elements 840, 844, 848, and 852. The semiconductor array 820 includes semiconductor elements of various heights, widths, and lengths 822, 824, 826, and 828. Each cooling element 840, 844, 848, and 852 of the semiconductor cooling apparatus 810 is configured to thermally couple (e.g., positioned near each other to enable thermal transfer, positioned near each other to maximize thermal transfer, etc.) to a respective semiconductor element 822, 824, 826, and 828 of the array of semiconductor elements 820. The cooling apparatus 810 includes a plurality of heat exchangers 814, and a flexible manifold 812, described further in detail below.

In operation, the flexible manifolds 812 flex to conform to the height of the respective heat exchangers 814 (e.g., the flexible manifolds flex from 0.001 to 0.009 inches, the flexible manifolds flex from 0.01 to 0.09 inches, etc.). For example, the flexible manifold 812 of cooling element 840 flexes independently from the flexible manifolds 812 of the other cooling elements 844, 848, and 852 to conform to the height of the heat exchangers 814.

Figure 9:
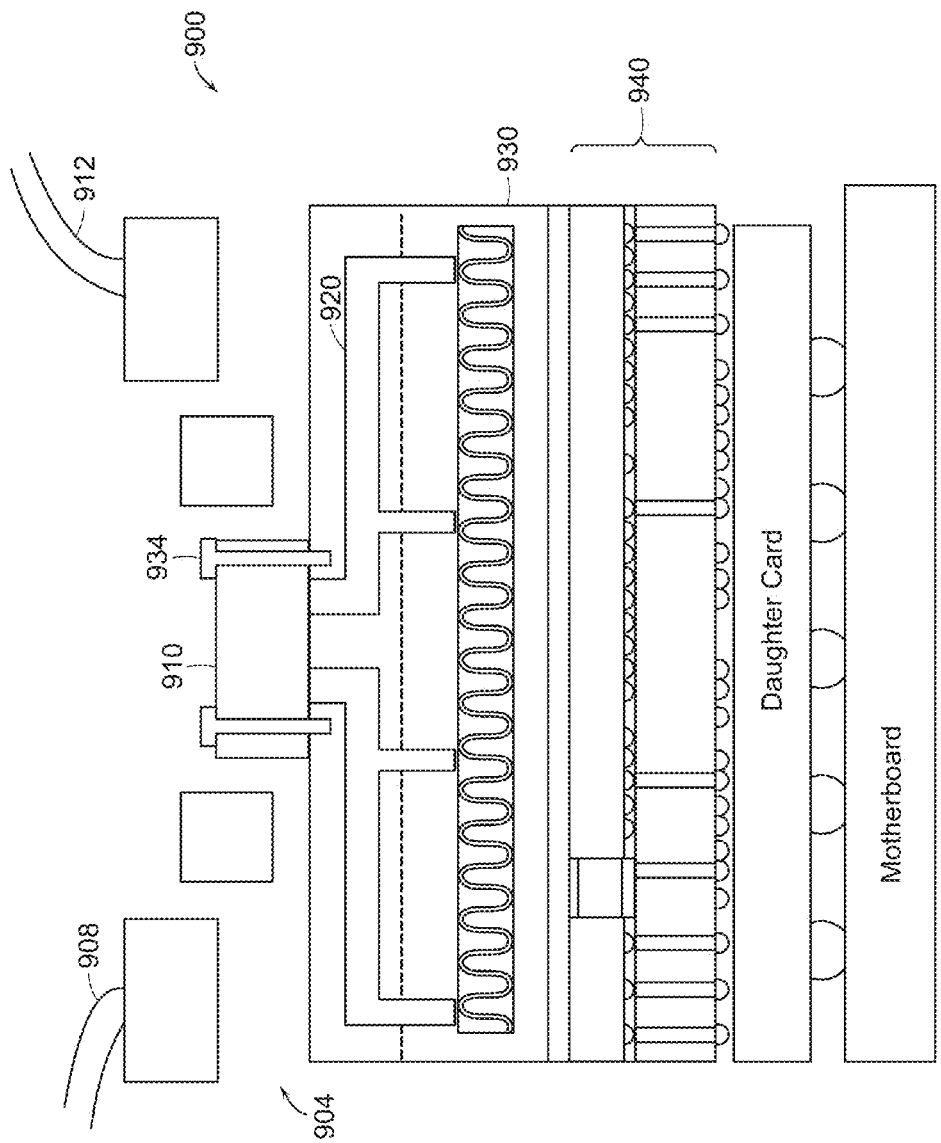
FIG. 9 is a cross-sectional view of an assembled semiconductor cooling apparatus, according to an illustrative embodiment.

FIG. 9 is a cross-sectional, side view of an assembled semiconductor cooling apparatus 900 (e.g., cooling apparatus 810 of FIG. 8) for cooling one or more semiconductor elements 940. The apparatus 900 includes one or more heat exchangers 930 coupled to the semiconductor element 940. The heat exchanger 930 also includes one or more internal passages 920. The passages 920 receive coolant for cooling the semiconductor element 940 and exhaust heated coolant from the heat exchanger 930.

This embodiment also provides flexibility in the thermal assembly of the cooling apparatus 900 to conform to differences in height of the semiconductor elements 940 and also to apply a force to the heat exchangers 930 coupled to respective semiconductor elements 940. However, in this embodiment, the flexibility is introduced by the manifold 904 rather than the flexible runners (as was illustrated in, for example, FIGS. 1-4). The manifold is located over the heat exchanger 930. A central portion 910 of the manifold 904 is connected to the heat exchanger 930 using a set of screws 934. Alternative mechanisms (e.g., threaded rods with nuts) or connection methods (e.g., adhesive) can be used in alternative embodiments. The flexibility in the manifold 904 enables the manifold to conform to the height stackup of the semiconductor element and its respective heat exchanger 930 and also apply a force to the stackup to maintain contact between the heat exchanger and its respective semiconductor element 940. Coolant is supplied to internal passages of the manifold 904 by a coolant supply line 908. The chilled coolant is delivered by the manifold to the one or more internal passages 920 of the heat exchanger 930. Heated coolant is then exhausted by the passages 920 of the heat exchanger 930 to one or more internal passages in the manifold 904. The returned coolant is then exhausted to a coolant return line 912 by the manifold 904.

The independent flexibility of the flexible manifold advantageously increases the heat transfer between the semiconductor element and the heat exchanger, thereby extending the life of the semiconductor element by promoting proper cooling of the semiconductor element. The independent flexibility of each manifold advantageously reduces the installation time and cost by removing any needed individual customizations, thereby decreasing the overall cost of the devices associated with the semiconductor element while increasing the heat transfer.

Figure 10:
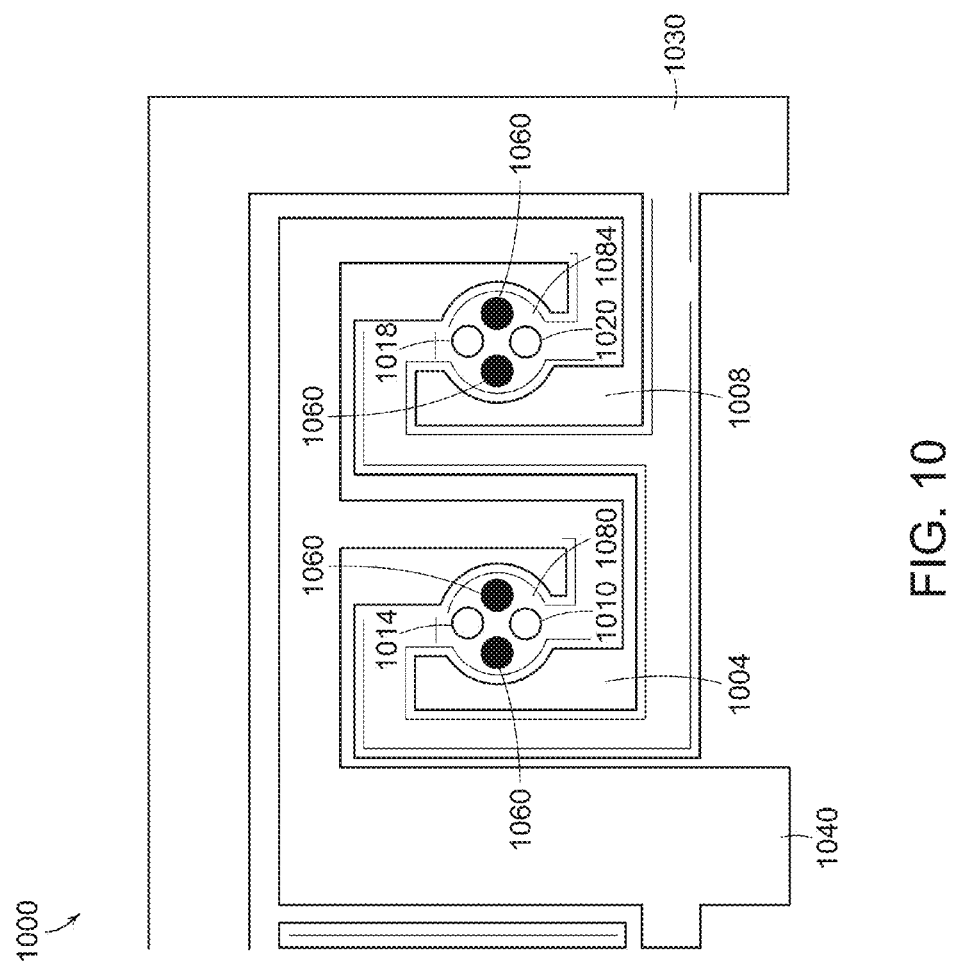
FIG. 10 is a top view of a flexible manifold of an exemplary cooling apparatus.

FIG. 10 is a top view of a manifold assembly 1000 of an exemplary cooling apparatus (e.g., flexible manifold 904 of FIG. 9). The manifold assembly 1000 includes two flexible manifolds 1004 and 1008. The central portions 1080 and 1084 of the manifolds 1004 and 1008, respectively, are connected to two corresponding heat exchangers (not shown) by screws that pass through holes 1060. The two manifolds 1004 and 1008 share a common coolant supply line 1040 and a common coolant return line 1030. Chilled coolant travels through passages in the manifolds and is provided to heat exchangers via outlets 1010 and 1020. Coolant exhausted by the heat exchangers is then received by inlets 1014 and 1018. The returned coolant is then pumped to coolant return line 1030 and subsequently exhausted and chilled again for reuse.

Various methods and mechanisms can be used to couple, connect or otherwise join various components described herein. For example, fasteners, such as screws, nuts, threaded rods, hollow bolts, etc., can be used. In some examples, adhesives or epoxies can be used. In some examples, components are bonded together by diffusion bonding, adhesive bonding and/or brazing. In some embodiments, o-rings, polymers, films, etc. can be used between two components to improve or create fluid seals between the components.

Comprise, include, and/or plural forms of each are open ended and include the listed parts and can include additional parts that are not listed. And/or is open ended and includes one or more of the listed parts and combinations of the listed parts.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein. In addition, the figures and foregoing descriptions identify a semiconductor to be thermally coupled to the heat exchanger, but the art described herein is not limited to semiconductors and can apply to any object which requires temperature control through heat rejection or addition.

What is claimed is:

1. A semiconductor cooling apparatus, comprising:
a thermal assembly configured to thermally couple to an array of semiconductor elements, the assembly comprising:
a plurality of heat exchangers, each heat exchanger configured to transfer heat from a respective semiconductor element to a coolant flowing through the respective heat exchanger;
a plurality of supply flexible runners and a plurality of return flexible runners, each supply flexible runner fluidly coupled to pass coolant to the respective heat exchanger and each return flexible runner fluidly coupled to exhaust coolant returned from the respective heat exchanger, each flexible runner configured to flex to conform to a height of a respective semiconductor element and to apply a force to the respective heat exchanger to maintain contact of the respective heat exchanger with the respective semiconductor element; and
a manifold fluidly coupled to the plurality of supply flexible runners and the plurality of return flexible runners, the manifold configured to supply coolant to the supply flexible runners and to exhaust returned coolant from the return flexible runners, the manifold comprising upper and lower planar surfaces and a sidewall,
wherein each of the supply flexible runners and the return flexible runners extends from the sidewall of the manifold,
wherein each of the supply flexible runners and the return flexible runners comprises respective upper and lower planar surfaces, and
wherein the respective lower planar surfaces of the supply flexible runners, the return flexible runners and the manifold are co-planar with one another.

2. The apparatus of claim 1, wherein the manifold has an input that is configured to couple to a coolant supply line and an output that is configured to couple to a coolant return line.

3. The apparatus of claim 2, further comprising:
a coolant chilling apparatus coupled to the coolant supply line and the coolant return line and configured to chill coolant; and
a coolant pump configured to pump the coolant between the coolant chilling apparatus and the thermal assembly.

4. The apparatus of claim 1, wherein the plurality of supply and return flexible runners are located adjacent to the heat exchangers.

5. The apparatus of claim 4, wherein the manifold is located adjacent to the plurality of supply and return flexible runners.

6. The apparatus of claim 1, wherein a spring constant of each flexible runner is defined based on one or more of a wall thickness of the respective flexible runner, a material type of the respective flexible runner, or a geometric property of the respective flexible runner.

7. The apparatus of claim 1, wherein the semiconductor cooling apparatus comprises aluminum, aluminum alloys, copper, copper alloys, stainless steel, stainless steel alloys, titanium, titanium alloys, plastic, or any combination thereof.

8. The apparatus of claim 1, wherein each heat exchanger is configured to couple to a respective semiconductor element as a packaging lid for the respective semiconductor element.

9. A semiconductor cooling apparatus, comprising:
a thermal assembly configured to thermally couple to a semiconductor element, the assembly comprising:
a heat exchanger configured to transfer heat from the semiconductor element to a coolant flowing through the heat exchanger;
at least one flexible runner fluidly coupled to the heat exchanger to provide coolant to the heat exchanger and to exhaust returned coolant from the heat exchanger, the at least one flexible runner configured to flex to conform to a height of the semiconductor element and to apply a force to the heat exchanger to maintain contact of the heat exchanger with the semiconductor element; and
a manifold fluidly coupled to the at least one flexible runner and configured to supply coolant to the at least one flexible runner and configured to exhaust returned coolant from the at least one flexible runner, the manifold comprising upper and lower planar surfaces and a sidewall,
wherein the at least one flexible runner extends from the sidewall of the manifold,
wherein the at least one flexible runner comprises respective upper and lower planar surfaces, and
wherein the respective lower planar surfaces of the at least one flexible runner and the manifold are co-planar with one another.

10. The apparatus of claim 9, wherein the at least one flexible runner includes a supply conduit and a return conduit within the at least one flexible runner, where the supply conduit is configured to provide coolant to the heat exchanger and the return conduit is configured to exhaust returned coolant from the heat exchanger.

11. The apparatus of claim 9, wherein the at least one flexible runner includes at least one supply flexible runner and at least one return flexible runner, where the at least one supply flexible runner is configured to provide coolant to the heat exchanger and the at least one return flexible runner is configured to exhaust returned coolant from the heat exchanger.

12. The apparatus of claim 9, wherein the manifold has an input that is configured to couple to a coolant supply line and an output that is configured to couple to a coolant return line.

13. The apparatus of claim 12, further comprising:
a coolant chilling apparatus coupled to the coolant supply line and the coolant return line and configured to chill coolant; and
a coolant pump configured to pump the coolant between the coolant chilling apparatus and the thermal assembly.

14. The apparatus of claim 9, wherein the at least one flexible runner is located adjacent the heat exchanger.

15. The apparatus of claim 14, wherein the manifold is located adjacent the at least one flexible runner.

16. The apparatus of claim 9, wherein a spring constant of the flexible runner is defined based on one or more of a wall thickness of the flexible runner, a material type of the flexible runner, or a geometric property of the flexible runner.

17. The apparatus of claim 9, wherein the heat exchanger is configured to couple to the semiconductor element as a packaging lid for the semiconductor element.

18. A cooling apparatus, comprising:
a thermal assembly configured to thermally couple to an array of objects, the assembly comprising:
   a plurality of heat exchangers, each heat exchanger configured to transfer heat from an object in the array of objects to a coolant flowing through the heat exchanger;
   a plurality of supply flexible runners and a plurality of return flexible runners, each supply flexible runner fluidly coupled to pass coolant to a respective heat exchanger and each return flexible runner fluidly coupled to exhaust returned coolant from the respective heat exchanger, each flexible runner configured to flex to conform to a height of a respective object in the array of objects and to apply a force to the respective heat exchanger to maintain contact of the heat exchanger with the respective object in the array of objects; and
   a manifold fluidly coupled to the plurality of supply flexible runners and the plurality of return flexible runners, the manifold configured to supply coolant to the supply flexible runners and to exhaust returned coolant from the return flexible runners, the manifold comprising upper and lower planar surfaces and a sidewall,
   wherein each of the supply flexible runners and the return flexible runners extends from the sidewall of the manifold,
   wherein each of the supply flexible runners and the return flexible runners comprises respective upper and lower planar surfaces, and
   wherein the respective lower planar surfaces of the supply flexible runners, the return flexible runners and the manifold are co-planar with one another.

19. The apparatus of claim 1, further comprising:
a central body having a supply conduit fluidly coupled to at least one supply flexible runner and a return conduit fluidly coupled to at least one return flexible runner,
wherein the supply and return conduits are not fluidly coupled to one another within the central body.

20. The apparatus of claim 19, wherein the central body, the fluidly coupled at least one supply flexible runner and the fluidly coupled at least one return flexible runner comprise a unitary structure.

21. The apparatus of claim 19, wherein at least one of the supply flexible runners and at least one of the return flexible runners extend from the central body in a J-shaped pattern.

22. A cooling apparatus, comprising:
a heat exchanger configured to transfer heat, from an element disposed adjacent to the heat exchanger, to a coolant conduit disposed within the heat exchanger;
a central body disposed adjacent the heat exchanger and having a supply conduit fluidly coupled to a supply runner and a return conduit fluidly coupled to a return runner, wherein the supply and return conduits are not fluidly coupled to one another within the central body, the central body comprising upper and lower planar surfaces and a sidewall;
the supply runner having a conduit fluidly coupled to the coolant conduit of the heat exchanger; and
the return runner having a conduit fluidly coupled to the coolant conduit of the heat exchanger,
wherein each of the supply and return runners is configured to flex and apply a force to the heat exchanger to maintain contact with the adjacent element,
wherein the central body, the supply runner and the return runner comprise a unitary structure,
wherein each of the supply and return runners extends from the sidewall of the central body,
wherein each of the supply flexible runners and the return flexible runners comprises respective upper and lower planar surfaces, and
wherein the respective lower planar surfaces of the supply runner, the return runner and the central body are co-planar with one another.

23. A cooling apparatus, comprising:
a heat exchanger configured to transfer heat, from an element disposed adjacent to the heat exchanger, to a coolant conduit disposed within the heat exchanger;
a central body disposed adjacent the heat exchanger and having a supply conduit fluidly coupled to a supply runner and a return conduit fluidly coupled to a return runner, wherein the supply and return conduits are not fluidly coupled to one another within the central body, the central body comprising upper and lower planar surfaces and a sidewall;
the supply runner having a conduit fluidly coupled to the coolant conduit of the heat exchanger; and
the return runner having a conduit fluidly coupled to the coolant conduit of the heat exchanger,
wherein each of the supply and return runners is configured to flex and apply a force to the heat exchanger to maintain contact with the adjacent element,
wherein the central body, the supply runner and the return runner comprise a unitary structure,
wherein each of the supply and return runners extends from the sidewall of the central body,
wherein each of the supply flexible runners and the return flexible runners comprises respective upper and lower planar surfaces,
wherein the respective lower planar surfaces of the supply runner, the return runner and the central body are co-planar with one another, and
wherein the supply and return runners extend from the central body in a J-shaped pattern.

24. A semiconductor cooling apparatus, comprising:
a thermal assembly configured to thermally couple to an array of semiconductor elements, the assembly comprising:
   a plurality of heat exchangers, each heat exchanger configured to transfer heat from a respective semiconductor element to a coolant flowing through the respective heat exchanger;
   a plurality of supply flexible runners and a plurality of return flexible runners, each supply flexible runner fluidly coupled to pass coolant to the respective heat exchanger and each return flexible runner fluidly coupled to exhaust coolant returned from the respective heat exchanger, each flexible runner configured to flex to conform to a height of a respective semiconductor element and to apply a force to the respective heat exchanger to maintain contact of the respective heat exchanger with the respective semiconductor element;
   a manifold fluidly coupled to the plurality of supply flexible runners and the plurality of return flexible runners, the manifold configured to supply coolant to the supply flexible runners and to exhaust returned coolant from the return flexible runners, the manifold comprising upper and lower planar surfaces and a sidewall; and a central body having a supply conduit fluidly coupled to at least one supply flexible runner and a return conduit fluidly coupled to at least one return flexible runner, wherein each of the supply flexible runners and the return flexible runners extends from the sidewall of the manifold, wherein each of the supply flexible runners and the return flexible runners comprises respective upper and lower planar surfaces, wherein the respective lower planar surfaces of the supply flexible runners, the return flexible runners and the manifold are co-planar with one another, wherein at least one of the supply flexible runners and at least one of the return flexible runners extend from the central body in a J-shaped pattern, and wherein the supply and return conduits are not fluidly coupled to one another within the central body.

\* \* \* \* \*